United States Patent [19]
Ikuina et al.

[11] Patent Number: 5,948,192
[45] Date of Patent: Sep. 7, 1999

[54] GLASS-CERAMIC SUBSTRATE AND METHOD OF PRODUCING THE SAME

[75] Inventors: Kazuhiro Ikuina; Hiroyuki Gotoh, both of Tokyo, Japan

[73] Assignee: NEC Corporation, Tokyo, Japan

[21] Appl. No.: 08/842,778

[22] Filed: Apr. 17, 1997

[30] Foreign Application Priority Data

Apr. 17, 1996 [JP] Japan ..... 8-095414

[51] Int. Cl.⁶ ..... C03B 29/00
[52] U.S. Cl. ..... 156/89.12; 257/501; 257/506; 428/432; 428/433; 428/689; 438/759; 156/89.11; 156/250
[58] Field of Search ..... 428/210, 209, 428/432, 433, 689, 469; 264/434, 618, 619; 156/89.11, 89.12, 250; 174/250, 261; 430/314, 316; 29/825, 829, 832; 438/759; 257/501, 506

[56] References Cited

U.S. PATENT DOCUMENTS

| | | | |
|---|---|---|---|
| 4,221,047 | 9/1980 | Narken et al. | 29/840 |
| 4,681,656 | 7/1987 | Byrum | 156/645 |
| 5,292,624 | 3/1994 | Wei | 430/313 |
| 5,512,353 | 4/1996 | Yokotani et al. | 428/210 |

FOREIGN PATENT DOCUMENTS 51-48166   4/1976   Japan.

*Primary Examiner*—Deborah Jones
*Assistant Examiner*—Stephen Stein

[57] ABSTRACT

A glass ceramic substrate is formed on a glass ceramic insulating layer with a conductor connecting a plurality of circuit patterns which are to be independent of each other as to electrical function. Baking the glass-ceramic insulating layer with the conductor, and opening by cutting after baking, forms a plurality of independent circuits with improved electrical resistance between them.

3 Claims, 1 Drawing Sheet

GLASS-CERAMIC SUBSTRATE AND METHOD OF PRODUCING THE SAME

BACKGROUND OF THE INVENTION

The present invention relates to a glass-ceramic substrate for mounting LSI devices densely, particularly a glass-ceramic substrate which can be baked at low temperature, and a method of producing the same.

In parallel with the development of semiconductor technologies, there is an increasing demand for electronic apparatuses with miniature system configurations and operable at high speed. Today, semiconductor devices with high density and high integration are available in the form of VLSIs (Very Large Scale Integrated Circuits) and ULSIs (Ultra Large Scale Integrated Circuits). Mounting technologies for assembling VLSIs and ULSIs need extremely high density and fineness. Particularly, the prerequisite with a substrate for mounting semiconductor devices is that the wiring be fine enough to meet the increasing wiring density. Another prerequisite with this kind of substrate is that the dielectric constant of the material of the substrate be reduced, and dense wiring be enhanced in order to implement low wiring resistance and high-speed operation.

A glass-ceramic laminate substrate has been developed and put to practical use as an LSI substrate. Wiring conductors for use in this kind of substrate are implemented by Ag, Cu or similar low resistance metal. To produce a glass-ceramic laminate substrate, powder consisting of glass and ceramic is mixed with an organic binder so as to prepare a slurry. The slurry is dried to form a green sheet. After via holes have been formed in the green sheet, a conductive paste is buried in the via holes. Subsequently, a preselected electric circuit pattern is formed on the green sheet by screen printing. A plurality of green sheets each having such a structure are laminated and then baked at a temperature ranging from about 850° C. to 1,000° C.

However, at the temperature as high as 850° C. to 1,000° C., oxidation reduction occurs between Ag, Cu or a similar metallic conductor and the glass-ceramic, resulting in the interchange of electrons. In this condition, a potential difference occurs between two independent electric circuits which are not connected together. Consequently, Ag ions or Cu ions migrate through the glass along the electric field, and short the two independent circuits in due course of time. That is, while the two electric circuits are open before baking, they are shorted or the insulating resistance noticeably falls after baking. This kind of defect becomes more conspicuous with an increase in wiring density.

SUMMARY OF THE INVENTION

It is therefore an object of the present invention to provide a glass-ceramic substrate capable of preventing metal ions from migrating during baking, and free from shorting during baking despite densely wired electric circuits.

In accordance with the present invention, in a glass-ceramic substrate, a continuous conductor provided on a glass-ceramic insulating layer is cut after baking to thereby form independent circuits.

Also, in accordance with the present invention, in a glass-ceramic substrate, a continuous conductor provided on a glass-ceramic insulating layer is cut after baking to thereby form independent circuits. Then a plurality of glass-ceramic insulating layers each having the respective independent circuits are laminated.

Further, in accordance with the present invention, a method of producing a glass-ceramic substrate has the steps of forming on a glass-ceramic insulating layer a conductor connecting a plurality of circuits which should be independent of each other as to an electrical function, baking the glass-ceramic insulating layer with the conductor, and cutting, after baking, the conductor to thereby forms a plurality of independent circuits.

BRIEF DESCRIPTION OF THE DRAWINGS

The above and other objects, features and advantages of the present invention will become apparent from the following detailed description taken with the accompanying drawings in which.

DESCRIPTION OF THE PREFERRED EMBODIMENT

A glass-ceramic substrate embodying the present invention and a method of producing the same will be described hereinafter.

Figure 1:
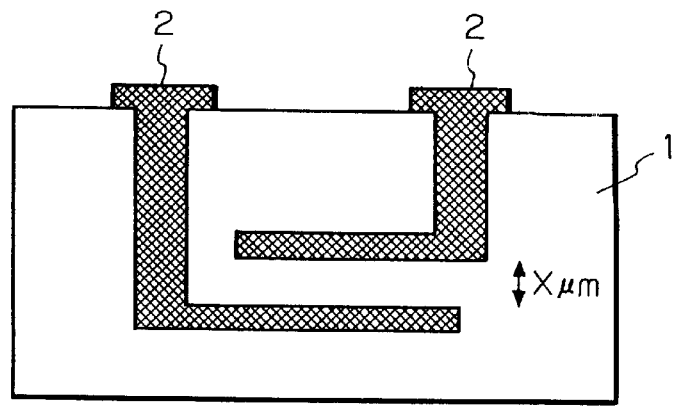
FIG. 1 is a section showing a substrate for evaluation having a glass-ceramic layer for insulation and an Ag or Cu conductive layer.
Figure 2A:
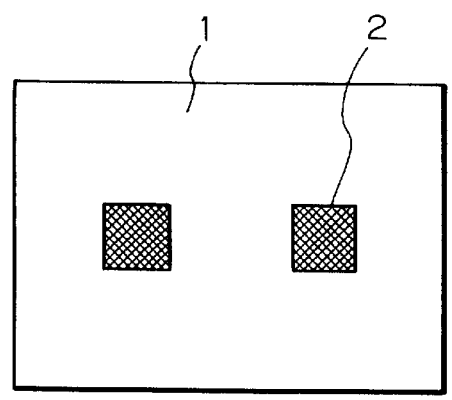
FIG. 2A is a plan view of a conventional substrate for evaluation.
Figure 2B:
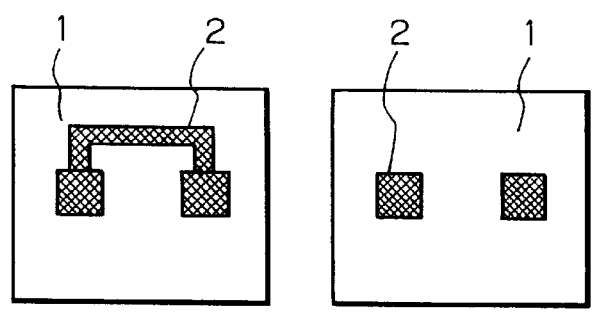
FIG. 2B is a plan view of a substrate for evaluation embodying the present invention.

FIG. 1 of the drawings shows a substrate for evaluation having a glass-ceramic layer 1 for insulation and Ag or Cu conductive layers 2. The conductive layers 2 are spaced from each other by a distance of x microns. FIGS. 2A and 2B are plan views respectively showing a conventional substrate and a substrate embodying the present invention. As shown in FIG. 2B, the substrate of the present invention is shorted before baking, i.e., preshorted, and the unnecessary pattern is removed after baking.

Table 1 shown below lists electric resistances between independent circuits and measured with the above two different substrates after baking.

TABLE 1

| Conductor | Distance between Conductors ($\mu$m) | Resistance between Conductors ($\Omega$) | |
|---|---|---|---|
| | | Non-Preshorted Substrate | Preshorted Substrate |
| Ag | 20 | shorted | above $9 \times 10^{14}$ |
| " | 40 | shorted | above $9 \times 10^{14}$ |
| " | 60 | shorted | above $9 \times 10^{14}$ |
| " | 80 | shorted | above $9 \times 10^{14}$ |
| " | 100 | shorted | above $9 \times 10^{14}$ |
| " | 120 | shorted | above $9 \times 10^{14}$ |
| " | 140 | shorted | above $9 \times 10^{14}$ |
| " | 160 | $2 \times 10^2 \, \Omega$ | above $9 \times 10^{14}$ |
| " | 180 | $7 \times 10^4 \, \Omega$ | above $9 \times 10^{14}$ |
| " | 200 | $3 \times 10^6 \, \Omega$ | above $9 \times 10^{14}$ |
| Cu | 20 | shorted | above $9 \times 10^{14}$ |
| " | 40 | shorted | above $9 \times 10^{14}$ |
| " | 60 | shorted | above $9 \times 10^{14}$ |
| " | 80 | shorted | above $9 \times 10^{14}$ |
| " | 100 | shorted | above $9 \times 10^{14}$ |
| " | 120 | shorted | above $9 \times 10^{14}$ |
| " | 140 | shorted | above $g \times 10^{14}$ |
| " | 160 | $8 \times 10^3 \, \Omega$ | above $9 \times 10^{14}$ |
| " | 180 | $7 \times 10^7 \, \Omega$ | above $9 \times 10^{14}$ |
| " | 200 | $9 \times 10^8 \, \Omega$ | above $9 \times 10^{14}$ |

As Table 1 indicates, the present invention provides an electrically highly reliable glass-ceramic laminate substrate with ease.

In accordance with the present invention, while the glass-ceramic substrate is held in its laminate state before baking, all the independent electric circuits existing in the substrate are connected beforehand or preshorted in the first layer. Specifically, a screen mask to which the circuits are connected beforehand is prepared, and then used at the time of circuit printing of the first layer. This allows the circuits to be easily connected together. During baking, all the circuits are held at electrically the same potential, preventing metal ions from migrating. Therefore, the baked substrate is free from electrical defects. After baking, conductors located at preselected positions are cut by a metal cutter, laser or similar implement in order to separate the circuits from each other. As a result, the substrate is provided with the expected electrical function.

A plurality of such glass-ceramic insulating layers, each having the respective independent circuits may be laminated.

A drive force causing ion migration to occur is a potential difference between circuits occurring at a temperature of 850° C. to 1,000° C. during baking, as discussed earlier. In accordance with the present invention, the glass-ceramic substrate has its circuits preshorted before baking, maintaining the circuits electrically at the same potential. This practically obviates the migration of metal ions which would result in shorting at the time of baking.

In summary, it will be seen that the present invention provides a glass-ceramic laminate substrate capable of implementing dense and fine wiring. The substrate is free from electrical defects during baking, and therefore highly reliable.

Various modifications will become possible for those skilled in the art after receiving the teachings of the present disclosure without departing from the scope thereof.

What is claimed is:

1. A first glass-ceramic substrate comprising a plurality of independent electric circuits formed on a glass-ceramic insulating layer, said circuits being a product of (a) forming a plurality of circuit patterns on said insulating layer, (b) baking said layer with said patterns while said circuit patterns are electrically connected together by a continuous electrical conductor formed on said insulating layer, and (c) electrically opening by cutting said conductor after said baking to leave said independent circuits on said layer, ion diffusion between said circuit patterns during said baking being prevented by said connected continuous conductor that connects and thereby maintains said circuit patterns at a same electrical potential, resistance between said independent circuits after said baking being increased by presence of said conductor during said baking.

2. A glass-ceramic substrate as in claim 1, further comprising at least one additional glass ceramic substrate laminated to said first glass-ceramic substrate, said at least one additional substrate having independent circuits thereon.

3. A method of producing a glass-ceramic substrate, comprising the steps of:

forming on a glass-ceramic insulator layer, a plurality of circuit patterns;

forming on said glass-ceramic insulator layer, a continuous conductor electrically connecting together said plurality of circuit patterns;

baking said glass-ceramic insulating layer with said circuit patterns and said continuous conductor; and opening by cutting, after said baking, said conductor to thereby form a plurality of circuits independent of each other as to electrical function.

\* \* \* \* \*